US007084448B2

(12) United States Patent
DeBoer et al.

(10) Patent No.: US 7,084,448 B2
(45) Date of Patent: Aug. 1, 2006

(54) DOUBLE SIDED CONTAINER PROCESS USED DURING THE MANUFACTURE OF A SEMICONDUCTOR DEVICE

(75) Inventors: Scott J. DeBoer, Boise, ID (US); Ronald A. Weimer, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 10/786,348

(22) Filed: Feb. 24, 2004

(65) Prior Publication Data

US 2004/0164335 A1  Aug. 26, 2004

Related U.S. Application Data

(62) Division of application No. 09/855,217, filed on May 14, 2001, now Pat. No. 6,696,336.

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/296; 257/303; 257/306
(58) Field of Classification Search ................ 257/296, 257/303, 304, 306, 307, 308, 309, 310
See application file for complete search history.

(56) References Cited

U.S. PATENT DOCUMENTS 4,656,732 A    4/1987  Teng et al. ................. 438/639

| 5,338,700 A | 8/1994 | Dennison et al. ............. 437/60 |
| 5,401,681 A | 3/1995 | Dennison ...................... 437/60 |
| 5,834,845 A | 11/1998 | Stolmeijer ................... 257/752 |
| 5,843,830 A | 12/1998 | Graettinger et al. ........ 438/396 |
| 5,844,771 A | 12/1998 | Graettinger et al. ........ 361/303 |

(Continued)

OTHER PUBLICATIONS

Related application entitled: "Reduced Aspect Ratio Digit Line Contact Process Flow Used During the Formation of a Semiconductor Device", by Brent A. McClure, Micron Technology, Inc., U.S. Appl. No. 09/765,885, filed Jan. 16, 2001.

*Primary Examiner*—Hoai Pham
(74) *Attorney, Agent, or Firm*—Kevin D. Martin (57) ABSTRACT

A method used during the formation of a semiconductor device comprises providing a wafer substrate assembly comprising a plurality of digit line plug contact pads and capacitor storage cell contact pads which contact a semiconductor wafer. A dielectric layer is provided over the wafer substrate assembly and etched to expose the digit line plug contact pads, and a liner is provided in the opening. A portion of the digit line plug is formed, then the dielectric layer is etched again to expose the capacitor storage cell contact pads. A capacitor bottom plate is formed to contact the storage cell contact pads, then the dielectric layer is etched a third time using the liner and the bottom plate as an etch stop layer. A capacitor cell dielectric layer and capacitor top plate are formed which provide a double-sided container cell. An additional dielectric layer is formed, then the additional dielectric layer, cell top plate, and the cell dielectric are etched to expose the digit line plug portion. Finally, a second digit line plug portion is formed to contact the first plug portion. A novel structure resulting from the inventive method is also discussed.

13 Claims, 10 Drawing Sheets

U.S. PATENT DOCUMENTS

| | | | |
|---|---|---|---|
| 5,869,861 A | 2/1999 | Chen | 257/306 |
| 5,956,594 A | 9/1999 | Yang et al. | 438/396 |
| 5,989,952 A | 11/1999 | Jen et al. | 438/253 |
| 6,046,093 A | 4/2000 | DeBoer et al. | 438/396 |
| 6,100,137 A | 8/2000 | Chen et al. | 438/253 |
| 6,127,260 A | 10/2000 | Huang | 438/253 |
| 6,140,172 A | 10/2000 | Parekh | 438/238 |
| 6,168,984 B1 | 1/2001 | Yoo et al. | 438/239 |
| 6,187,624 B1 | 2/2001 | Huang | 438/253 |
| 6,190,960 B1 * | 2/2001 | Noble | 438/253 |
| 6,221,711 B1 | 4/2001 | Roberts et al. | 438/239 |
| 6,251,726 B1 | 6/2001 | Huang | 438/253 |
| 6,300,191 B1 | 10/2001 | Yu et al. | 438/253 |
| 6,507,064 B1 | 1/2003 | Tang et al. | 257/306 |

* cited by examiner

DOUBLE SIDED CONTAINER PROCESS USED DURING THE MANUFACTURE OF A SEMICONDUCTOR DEVICE

This is a division of U.S. patent application Ser. No. 09/855,217 filed May 14, 2001 and issued Feb. 24, 2004 as U.S. Pat. No. 6,696,336.

FIELD OF THE INVENTION

This invention relates to the field of semiconductor manufacturing and, more particularly, to a method for forming a container capacitor and digit line structure.

BACKGROUND OF THE INVENTION

During the manufacture of a semiconductor device such as dynamic random access memories (DRAMs), static random access memories (SRAMs), microprocessors, and logic devices, several structures are commonly formed. For example, contact openings to a conductive layer such as a doped monocrystalline silicon wafer, a polycrystalline silicon (polysilicon) layer, or a metal feature through a dielectric layer such as tetraethyl orthosilicate (TEOS) and/or borophosphosilicate glass (BPSG) can be formed. Further, openings are commonly formed within a dielectric layer as an early step in the formation of a container capacitor in a memory device.

Figure 1:
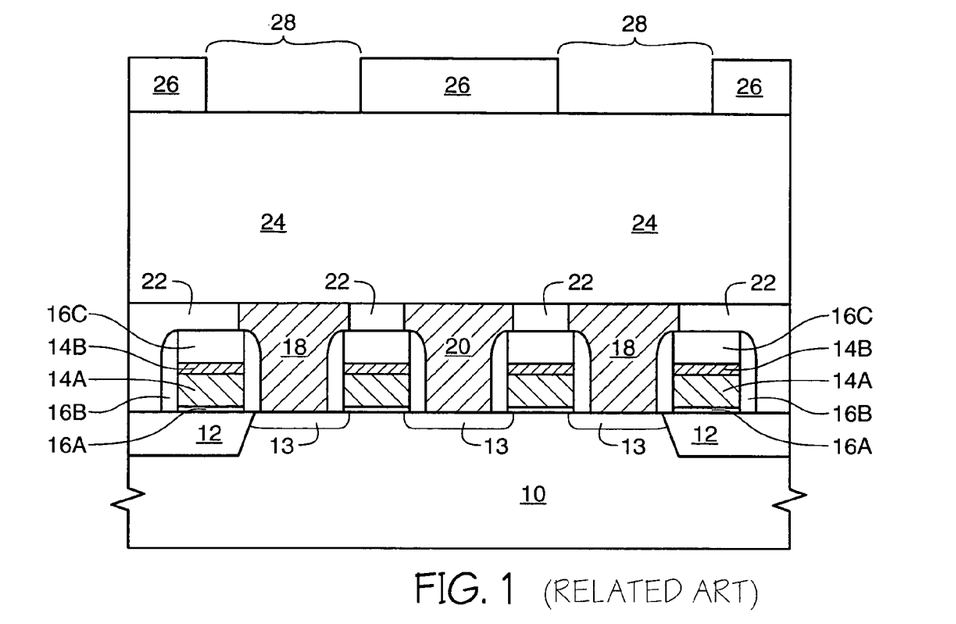
FIG. 1 is a cross section depicting a starting structure for a conventional process to form a dynamic random access device.

FIGS. 1–6 depict a conventional process used during the formation of a semiconductor memory device such as a DRAM to form double-sided storage capacitors and digit line contacts. FIG. 1 depicts a semiconductor wafer substrate assembly comprising a semiconductor wafer 10, field oxide 12, doped wafer areas 13, transistor control gates typically comprising a polysilicon gate 14A and silicide 14B, and surrounding dielectric typically comprising gate oxide 16A, silicon nitride spacers 16B, and capping layer 16C, for example silicon nitride. A conventional device further comprises polysilicon contact pads including pads 18 to which container capacitor storage nodes will be electrically coupled and pads 20 (only one depicted) which will form a portion of a digit line contact to the wafer 10. A dielectric layer 22, for example BPSG, separates the pads. Also depicted is a second layer of dielectric 24 which can be one or more layers of TEOS and/or BPSG. With current technology, layer 24 can be between about 10,000 angstroms (Å) and about 20,000 Å thick. A layer of photoresist 26 defines openings 28 which overlie pads 18 to which the container capacitors will be electrically coupled. The structure of FIG. 1 is exposed to a vertical anisotropic etch which removes the dielectric layer 24 selective to the polysilicon contact pads 18.

Figure 2:
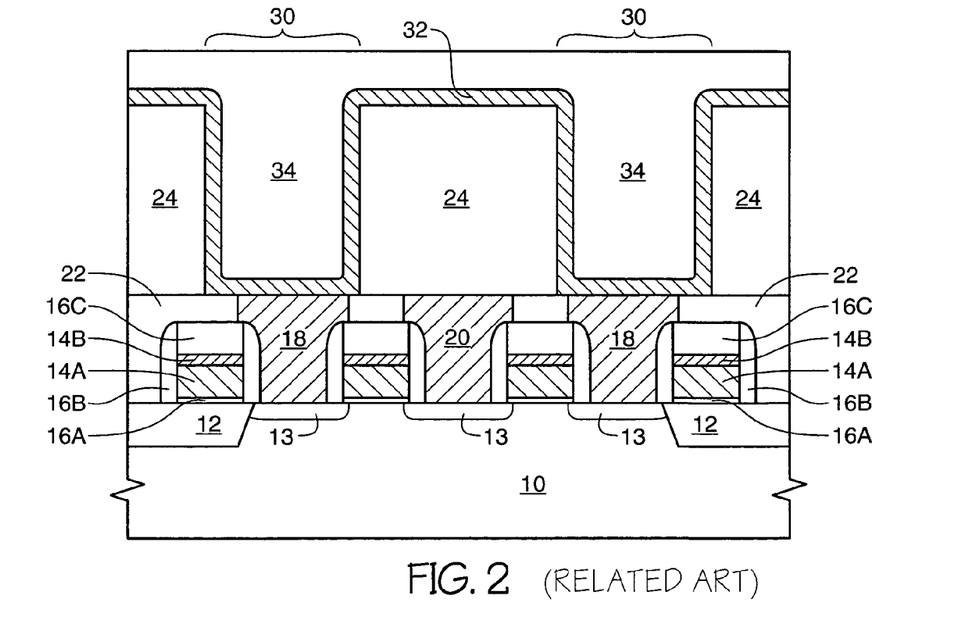
FIG. 2 depicts the FIG. 1 structure after etching openings in oxide to define capacitor bottom plates and after formation of a protective layer.
Figure 3:
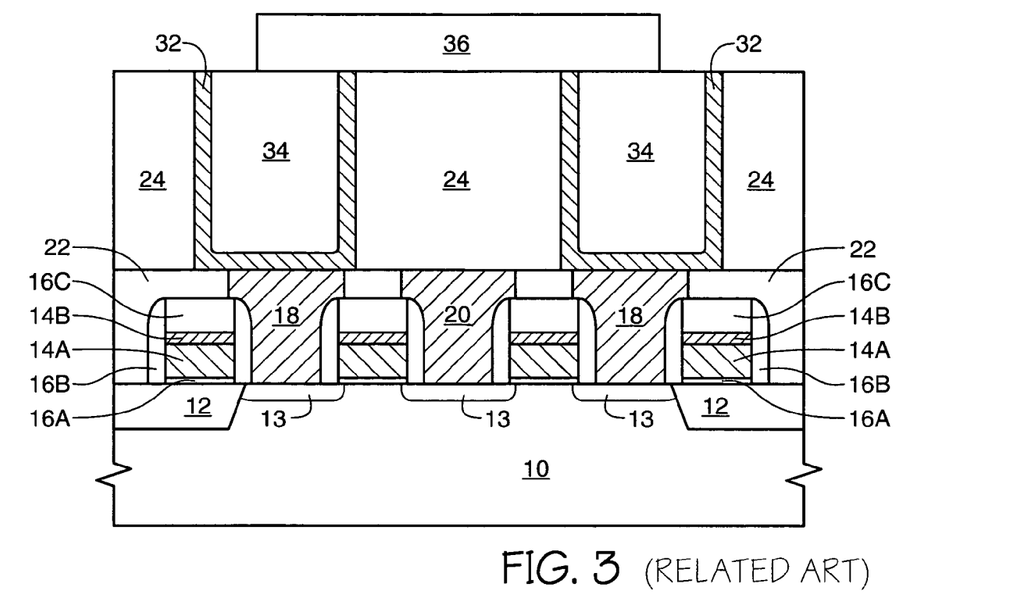
FIG. 3 depicts the FIG. 2 structure after planarizing the surface and after formation of a photoresist layer.

FIG. 2 depicts openings 30 in dielectric 24 which result from the etch of the FIG. 1 structure, and the etch forms an opening having first and second cross-sectional sidewalls. Each opening is generally round or oval when viewed from the top down, and the sidewalls are cross-sectional as a round or oval opening will have one continuous sidewall. The etch exposes pads 18, which in turn contact doped regions 13. Pads 18, therefore, decrease the amount of oxide which the etch of the FIG. 1 structure must remove. Without pads 18, the etch would be required to remove the additional thickness of oxide layer 22 to expose doped regions 13.

After forming the openings a blanket layer of polysilicon 32, such as hemispherical silicon grain (HSG) is formed over exposed surfaces including pads 18. Subsequently, the openings are filled with a sacrificial protective material 34 such as photoresist and the HSG and a portion of dielectric 24 are removed, for example using chemical mechanical polishing (CMP). This removes the HSG from the horizontal surface of dielectric 24 to result in the polysilicon structures 32 of FIG. 3. A photoresist mask 36 is formed over the structure to protect the oxide layer between the two container capacitors depicted, then an oxide etch is completed to remove a portion of the exposed oxide, preferably about ⅔ of the thickness, depicted as 40 in FIG. 4. Next, the photoresist layers 34, 36 are removed and blanket layers of silicon nitride 42 (cell nitride) between about 40 Å and about 70 Å thick and top plate polysilicon 44 between about 500 Å and about 2,000 Å thick are formed. A planar layer of BPSG 46, which with current technology has a thickness of about 4,000 Å, is formed and a patterned photoresist layer 48 is formed which defines an opening 50 which will expose digit line contact pad 20.

Figure 5:
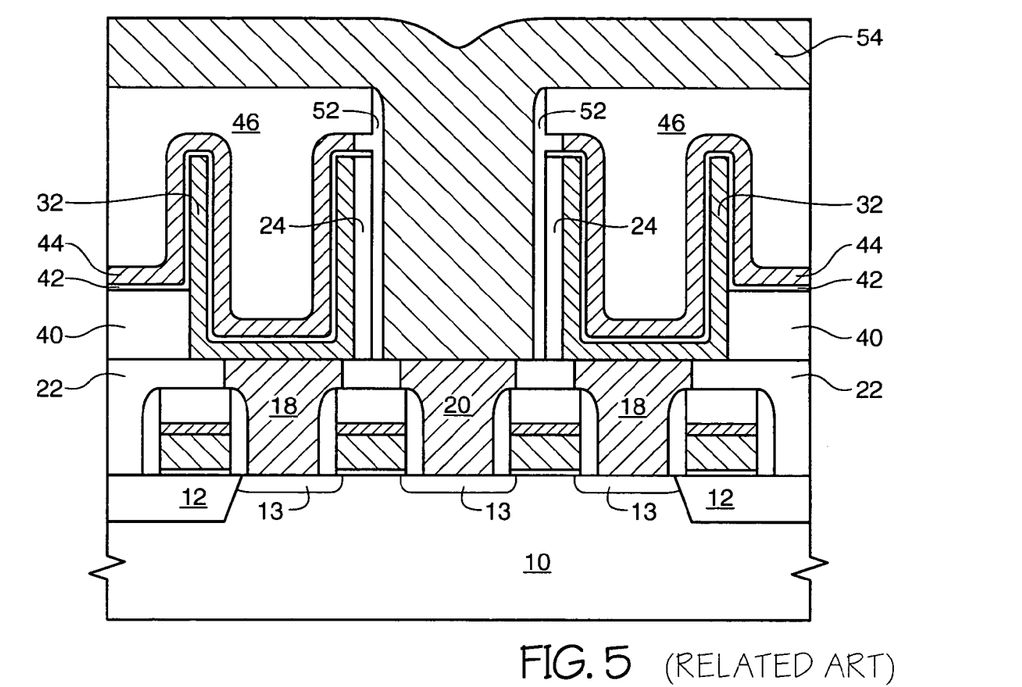
FIG. 5 depicts the FIG. 4 structure after etching the digit line contact opening, after forming a dielectric spacer layer to isolate the capacitor top plate layer, and after forming a digit line contact plug layer.
Figure 6:
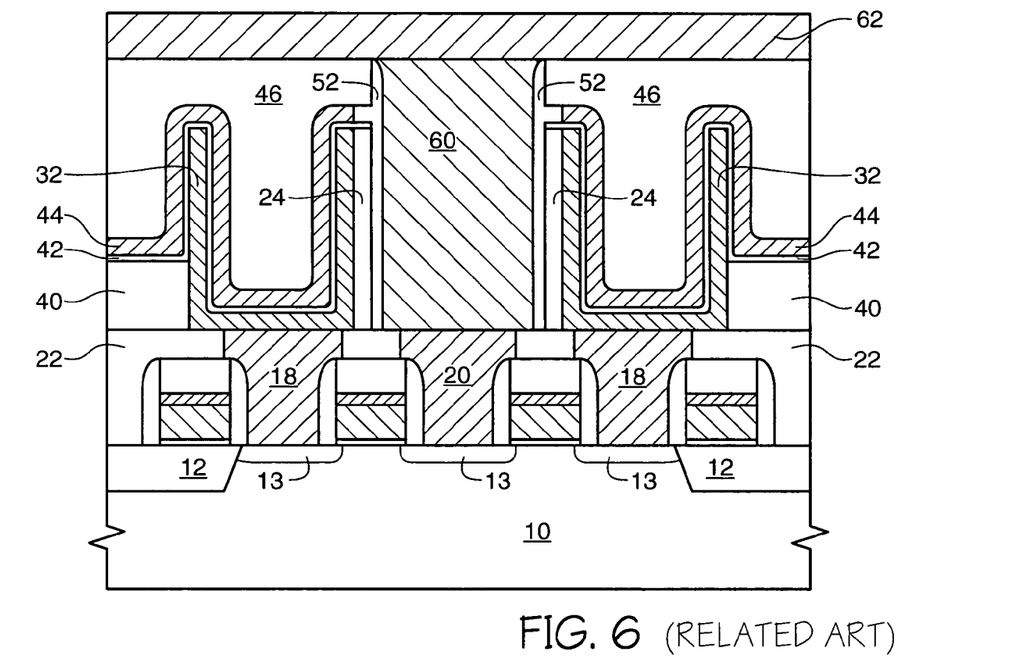
FIG. 6 depicts the FIG. 5 structure after etching the digit line contact plug layer to form a digit line contact plug, and after forming a metal layer which contacts the plug and forms a digit line contact runner.

Subsequently, as depicted in FIG. 5, digit line contact pad 20 is exposed by etching through BPSG 46, top plate polysilicon 44, cell nitride 42, and oxide dielectric 24. The etch, which can comprise one etch or a series of different etches to remove the different materials, must therefore etch through between about 15,000 Å and about 30,000 Å of material to expose contact pad 20. With current technology, the opening is formed to be between about 2,000 Å and about 3,000 Å wide, and thus the opening formed after the etch has an aspect ratio of about 10:1.

Subsequently, the conductive polysilicon top plate 44 is recessed within dielectric 46 and nitride 42 using an isotropic silicon etch. This etch also removes between about 200 Å to about 1,000 Å from exposed polysilicon pad 20, which does not unduly affect the performance of the pad. A conformal dielectric layer is formed, for example using chemical vapor deposition (CVD), and then a spacer etch is completed to form spacers 52 which are approximately 300 Å wide. A digit line plug process is completed to form a plug layer 54, for example comprising polysilicon, tungsten, or a multilayer structure from tungsten and titanium nitride/titanium silicide (TiN/TiSi$_x$), having a completed diameter of about 3,000 Å wide. A CMP step is performed to remove the plug layer 54 from the horizontal upper surface of the structure depicted to result in plug 60 of FIG. 6. Next, a digit line runner 62 is formed, for example from aluminum or copper. Wafer processing continues, for example to form various subsequent memory device structures.

Various problems are possible during the manufacturing process using the exemplary conventional process described above and other similar processes. One problem is that the oxide etch to define the digit line plug (see 50, FIG. 4) comes very close to the capacitor bottom plate 32. Thus minor misalignment of the mask 48 can produce a cell having the digit line plug shorted to the capacitor bottom plate. Another disadvantage of the conventional cell described is that the top plate is double-sided on only one portion of the bottom plate. The spacing between the bottom plate and the digit line plug is close enough that forming a double-sided top plate between the digit line plug and the bottom plate is not feasible. Further, it is difficult to etch the digit line contact opening defined by photoresist layer 48 at opening 50 in FIG. 4, as the aspect ratio of the completed opening is about 10:1. It is well known in the art that it is difficult to etch an opening having a high aspect ratio.

A method for forming a capacitor cell and digit line plug which reduces or eliminates various problems and disadvantages with conventional cells would be desirable.

SUMMARY OF THE INVENTION

The present invention provides a new method which, among other advantages, reduces problems associated with the manufacture of semiconductor devices, particularly alignment problems between an oxide etch to define a container capacitor bottom plate and an oxide etch which defines a digit line contact opening. In one exemplary embodiment a portion of a conductive digit line plug is formed before formation of capacitor storage plates, and is protected by a dielectric such as a nitride layer and a TEOS layer. Forming this portion of the digit line plug prior to forming the storage plates allows for a shallower etch, and can therefore be more accurately provided. An etch stop liner, for example a nitride layer and a TEOS layer is formed within the opening, then a plug portion is formed, for example comprising polysilicon or a titanium, titanium nitride, tungsten stack. Subsequently, an oxide etch which defines capacitor bottom plates is performed, and the bottom plate is provided. Another oxide etch is performed which removes the oxide from around the outside of the bottom plate and uses the nitride around the plug and the polysilicon bottom plate as an etch stop. Next, cell nitride, capacitor top plate, and planar dielectric layers are formed and a vertical etch is completed to remove the various layers overlying the previously formed digit line plug portion and to expose the plug. After forming a spacer to isolate the capacitor top plate, a conductive layer is formed to provide a second portion of a digit line plug and a digit line runner.

A novel semiconductor device structure is also encompassed by the present invention.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which may readily be determined by one of ordinary skill in the art by examination of the information herein.

DETAILED DESCRIPTION OF THE PREFERRED EMBODIMENT

Figure 7:
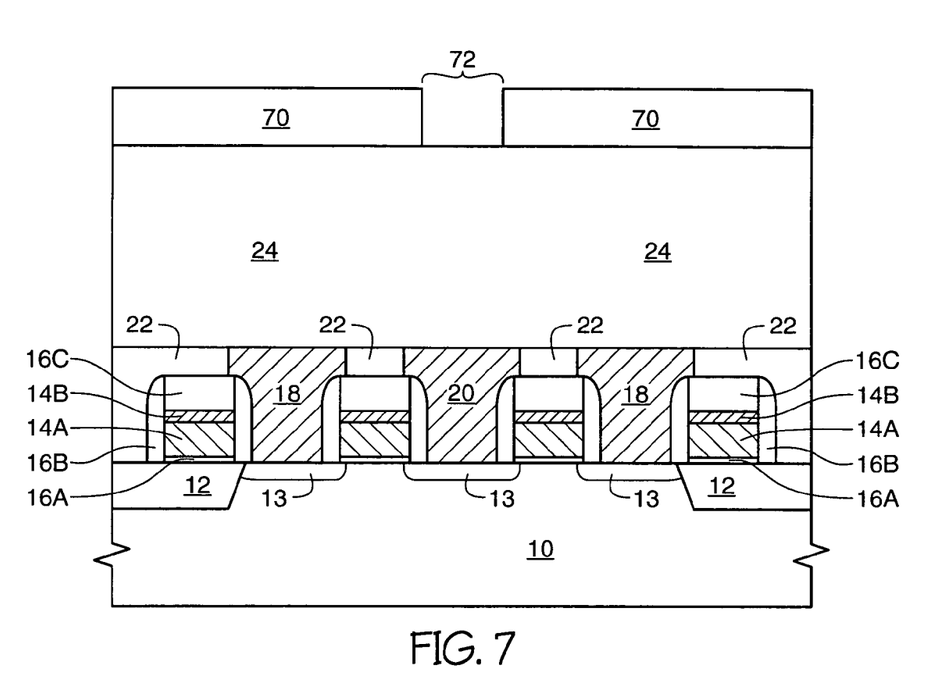
FIG. 7 depicts a starting structure comprising a semiconductor substrate assembly for one embodiment of the invention.

A first embodiment of an inventive method used during the formation of a semiconductor device is depicted in FIGS. 7–14. FIG. 7 depicts a semiconductor substrate assembly comprising a semiconductor wafer 10, field oxide 12, a transistor control gate comprising a polysilicon gate 14A and silicide 14B, surrounding dielectric including gate oxide 16A, nitride spacers 16B, and capping dielectric 16C, for example comprising tetraethyl orthosilicate (TEOS) and nitride. FIG. 7 further depicts capacitor storage node contact pads 18 comprising polysilicon, a digit line contact pad 20 comprising polysilicon, and an overlying dielectric 24 such as one or more layers of borophosphosilicate glass (BPSG) which has been chemically-mechanically planarized (CMP) in this exemplary embodiment to between about 10,000 Å and about 30,000 Å thick. A patterned photoresist layer 70 defines an opening 72 to the digit line contact pad 20. The structure depicted in FIG. 7 can be manufactured by one of ordinary skill in the art from the description herein.

After forming the FIG. 7 structure, BPSG layer 24 is etched to expose the digit line contact pad 20. An etch comprising an atmosphere of $C_4F_8$ at a flow rate of 50 standard cubic centimeters (sccm), a temperature of about 50° C., and a pressure of about 15 millitorr (mT) would remove about 100 Å of oxide/second. Thus for a BPSG layer 24 about 15,000 Å as described above, a duration of about 150 seconds would be sufficient. The contact opening should have a width of between about 1,000 Å and about 3,600 Å, preferably about 2,000 Å although the size of the opening will likely decrease with improved technology.

Figure 8:
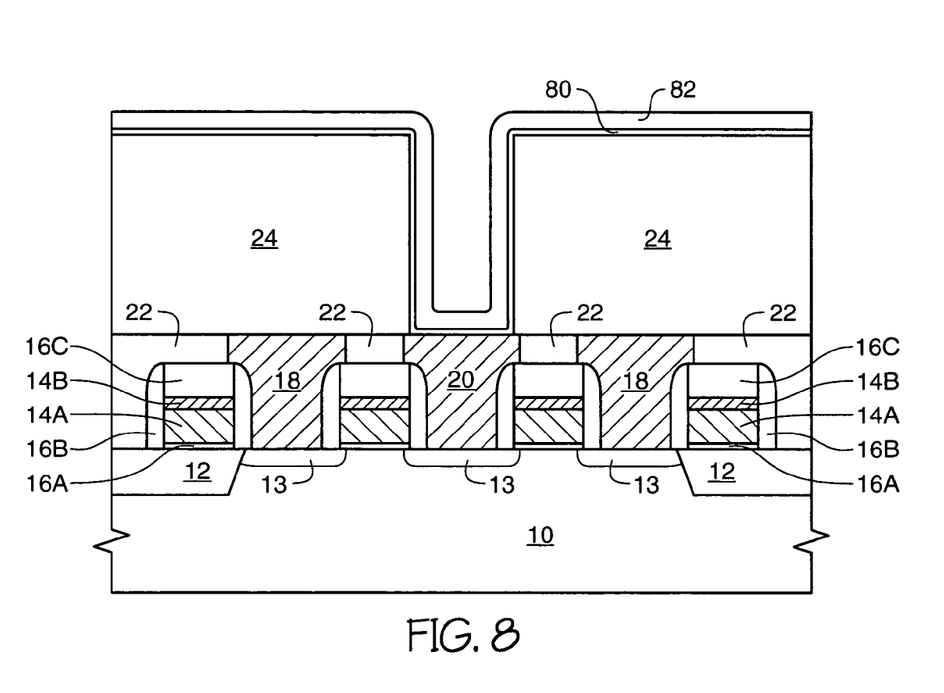
FIG. 8 depicts the FIG. 7 structure after etching a contact opening in a planar oxide layer and forming a pair of blanket dielectric layers.

Next, as depicted in FIG. 8, a first blanket dielectric layer 80, for example a silicon nitride layer between about 50 Å and about 250 Å, preferably about 200 Å, is formed using a low-pressure chemical vapor deposition (LPCVD) process. A second blanket dielectric layer 82, for example a high-pressure layer of tetraethyl orthosilicate (TEOS) between about 100 Å and about 500 Å, preferably about 200 Å, is formed.

Figure 9:
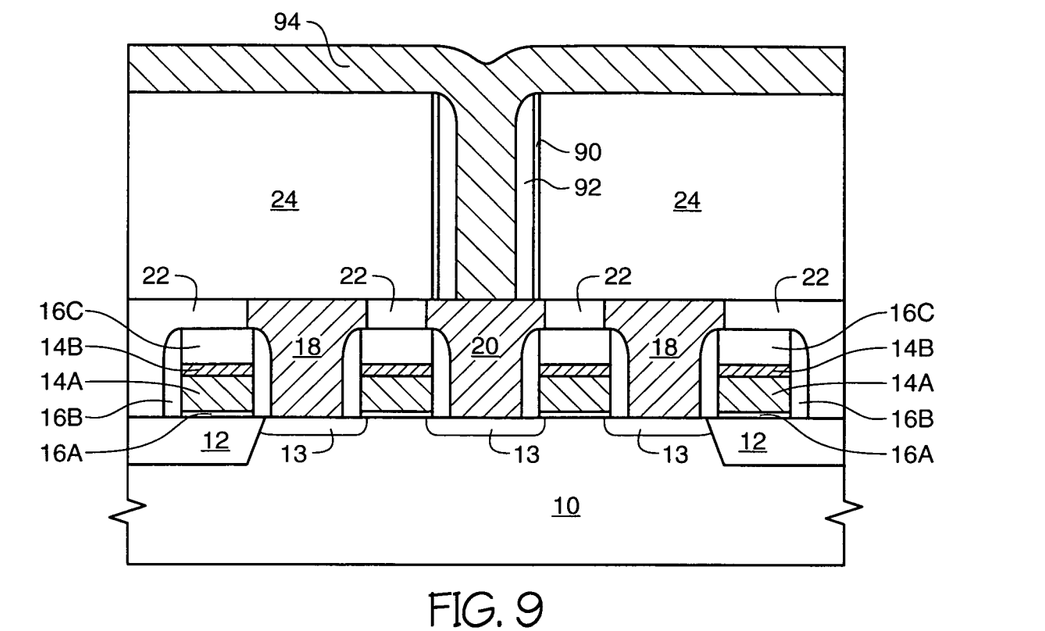
FIG. 9 depicts the FIG. 8 structure after forming a blanket plug layer over the assembly.

After forming the FIG. 8 structure a spacer etch is completed which is sufficient to etch the two dielectric layers 80, 82. This etch exposes the digit line contact pad 20 and forms a spacer having a first dielectric spacer portion 90 and a second dielectric spacer portion 92 as depicted in FIG. 9. Spacer portions 90 and 92 are formed from layers 80, 82 of FIG. 8. A digit line contact plug layer 94, for example an in situ doped polysilicon (ISDP) layer, a conventional stack of titanium, titanium nitride, and tungsten, or a CVD titanium nitride plug layer is formed to fill the plug opening. The layer is formed thick enough to fill in the opening between the spacers, which is typically at least half the width of the opening which remains after formation of the spacers. Thus layer 94 is targeted to between about 400 Å and about 2,000 Å, preferably about 1,000 Å. After forming the plug layer 94, the FIG. 9 structure is planarized, for example using CMP to remove the plug layer 94 except for the portion within the digit line contact plug opening 94.

Figure 10:
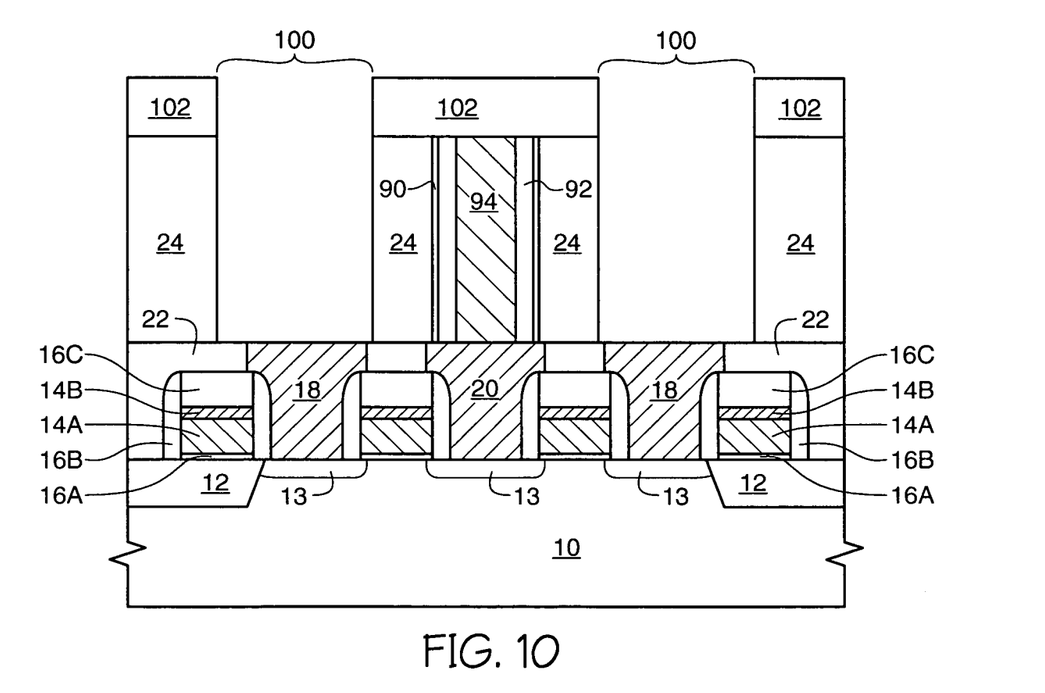
FIG. 10 depicts the FIG. 9 structure after patterning a pair of exemplary openings in a planar oxide layer to define container capacitors.
Figure 11:
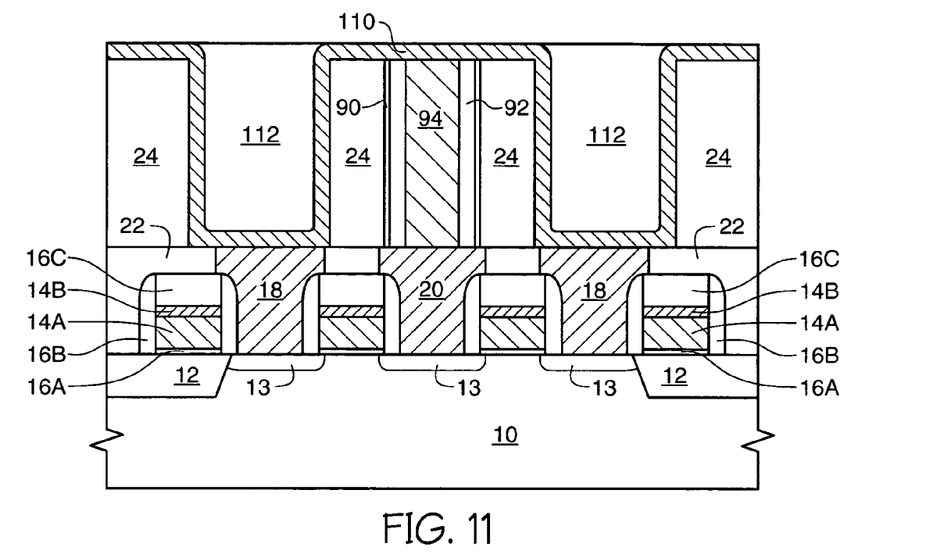
FIG. 11 depicts the FIG. 10 structure after forming a blanket capacitor bottom plate layer from a material such as rugged polysilicon or metal.
Figure 12:
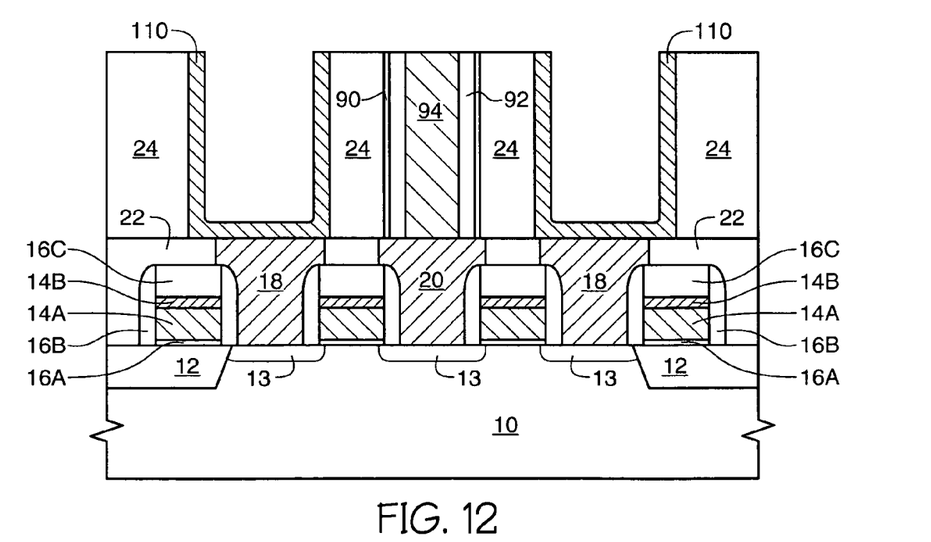
FIG. 12 depicts structure of FIG. 11 subsequent to a planarization step of the capacitor bottom plate layer.

Subsequently, referring to FIG. 10, container capacitor openings 100 are defined within dielectric 24 by providing a patterned photoresist layer 102 over dielectric 24 and etching to expose the capacitor contact pads 18. Photoresist layer 102 is removed and a blanket capacitor storage plate layer 110 is formed to contact the capacitor contact pads 18 as depicted in FIG. 11. The recesses defined by the capacitor storage plate layer are filled with a protective layer 112 such as photoresist, then the surface of the FIG. 11 structure is planarized using an etch back or by performing a CMP step. This planarization removes the portion of the storage plate layer on the horizontal upper surface of the FIG. 11 structure to separate the capacitor storage plates. The protective layer 112 is removed, and the structure of FIG. 12 remains.

Figure 13:
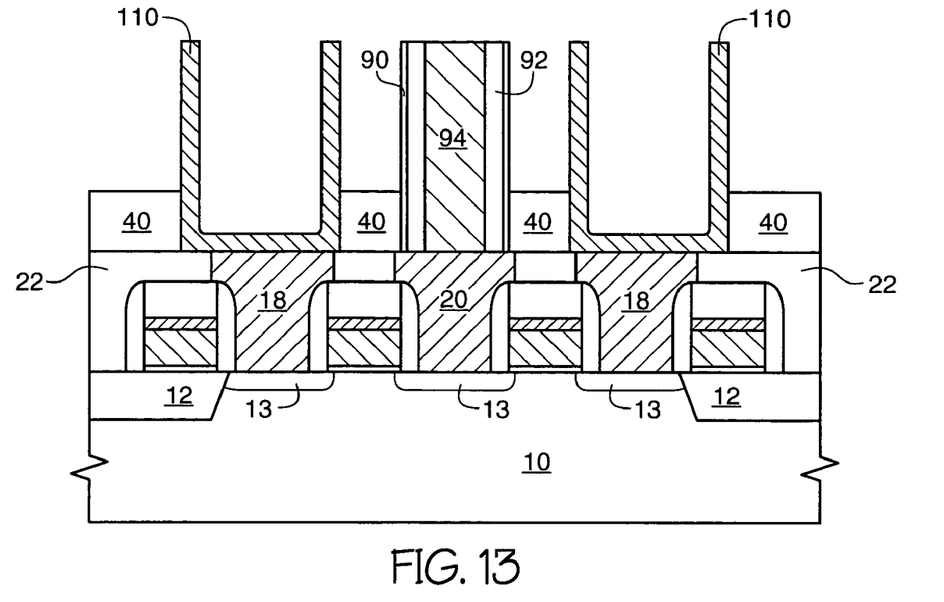
FIG. 13 depicts the FIG. 12 structure after a wet or dry dielectric etch which is selective to the lower electric material 110, plug material 94, and liner material 80, 82.

Next, an oxide etch is performed to remove a portion of layer 24 as depicted in FIG. 13. A sufficient amount of oxide is removed to facilitate enhanced electrical characteristics of the completed cell by increasing the capacitance between the capacitor storage plate and the top plate which is formed later by allowing a double-sided capacitor. In a 30,000 Å layer of BPSG, for example, the etch can be timed to thin the layer to between about 5,000 Å and about 15,000 Å. The nitride 90 and oxide 92 function at this step as an etch barrier or liner to prevent lateral etching of plug 94. A wet process etch chemistry comprising one or more of hydrofluoric acid (HF), buffered oxide etch (BOE), and nitric acid ($HNO_3$) would be sufficient, depending on the materials exposed for a particular implementation of the invention. The wet etch back chemistry must etch the BPSG 24 selectively to the TEOS oxide 92 at a ratio of at least 10:1, and preferably at a ratio about 100:1. A suitable etch for a particular embodiment is easily determined by one of ordinary skill in the art from the information herein, and wet etching of BPSG selectively to other materials is well documented in the art. An etch such as one of those described above will remove dielectric 24 at a rate of between 100 Å and 1,000 Å/minute selective to nitride 90 and lower electrode 110.

Figure 14:
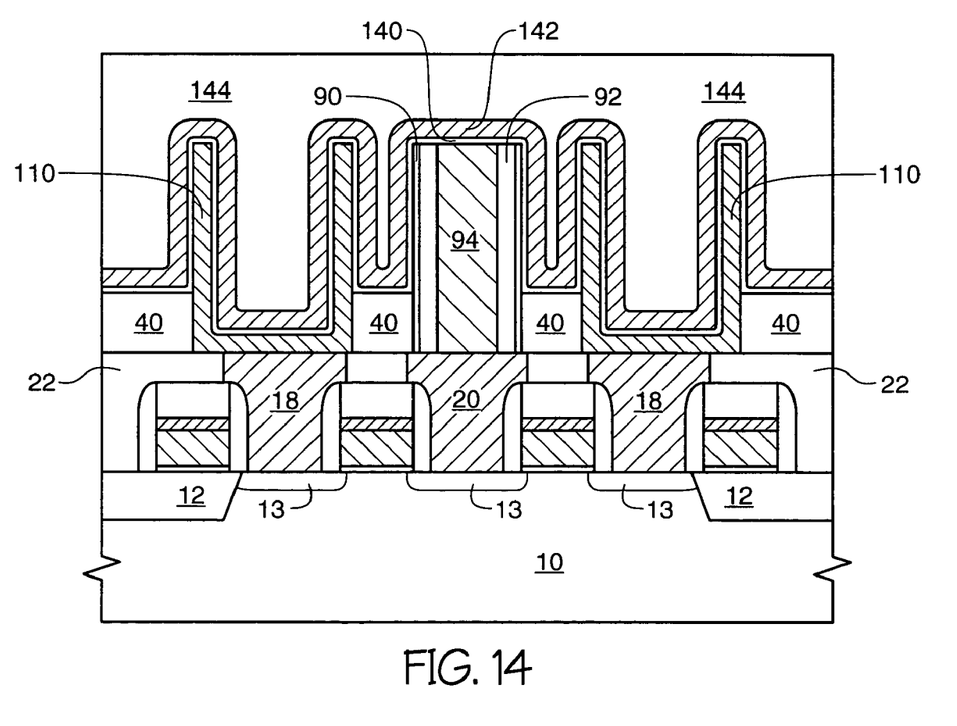
FIG. 14 depicts the structure of FIG. 13 subsequent to forming a capacitor cell dielectric layer, a capacitor top plate layer, and a planar oxide layer.
Figure 15:
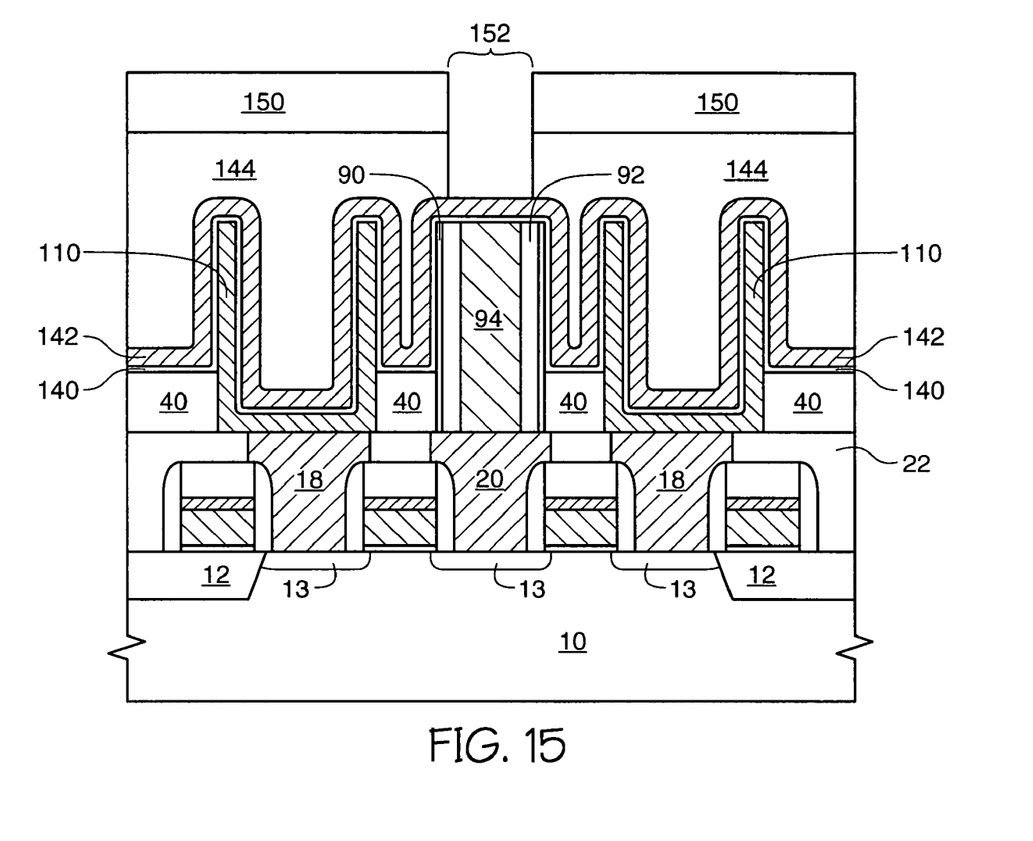
FIG. 15 depicts the FIG. 14 structure subsequent to forming patterned photoresist layer and after etching the planar oxide layer.
Figure 16:
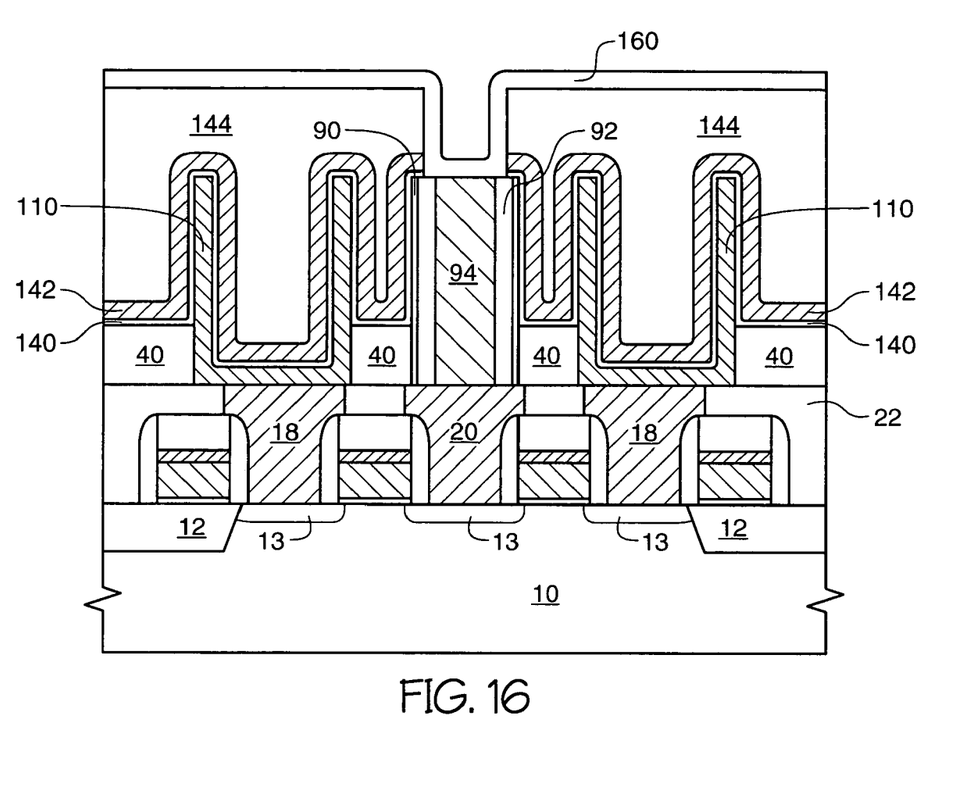
FIG. 16 depicts the FIG. 15 structure after etching the cell dielectric and top plate layers, removing the photoresist layer, and forming a dielectric spacer layer.
Figure 17:
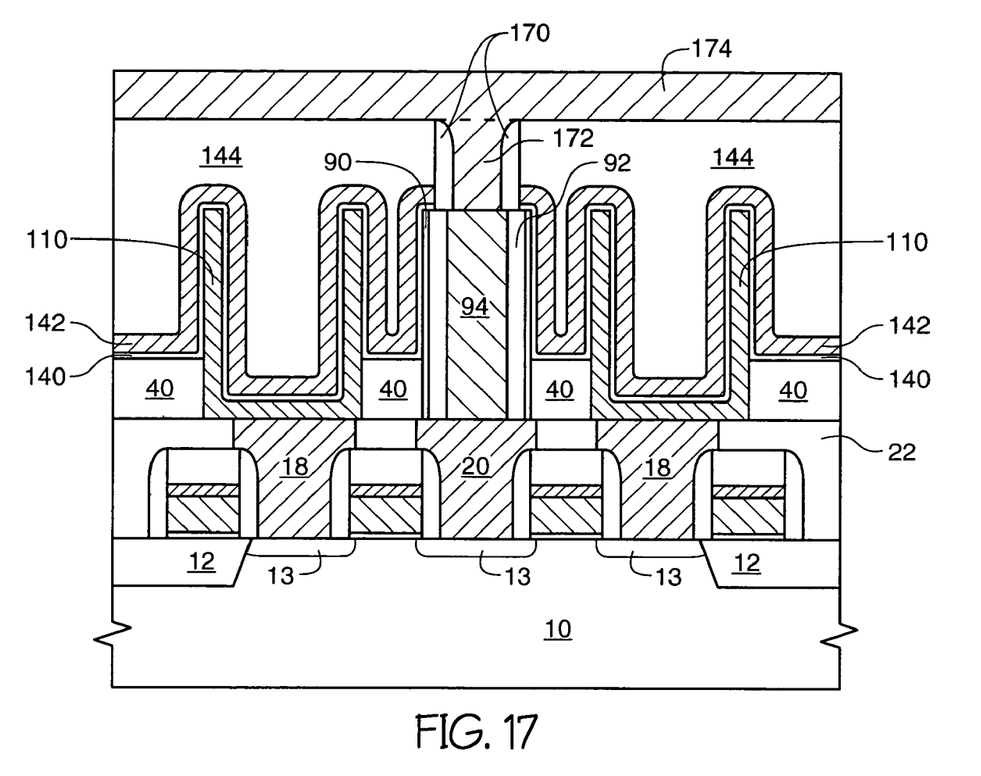
FIG. 17 depicts the FIG. 16 structure after performing a spacer etch then forming a digit line runner.

FIG. 14 depicts the FIG. 13 structure subsequent to forming a cell dielectric layer 140 between about 20 Å and about 300 Å thick (preferably about 60 Å thick), a capacitor top plate layer 142 between about 200 Å and about 2,000 Å thick (preferably about 500 Å thick), and a planar dielectric layer such as BPSG 144 between about 2,000 Å and about 5,000 Å thick (preferably about 4,000 Å thick). Subsequently, a patterned photoresist layer 150 as depicted in FIG. 15 is formed to define an opening 152 over the digit line contact plug 94. The planar dielectric layer 144 is etched to expose the capacitor top plate 142, then the capacitor top plate layer 142 and the cell dielectric layer 140 are etched to expose the digit line contact plug as depicted in FIG. 16. A conformal dielectric layer 160, such as a CVD silicon nitride or oxide layer, is formed over exposed surfaces, then a spacer etch is performed to result in dielectric spacers 170 as depicted in FIG. 17. A conductive layer, for example a layer of polysilicon or a titanium/titanium nitride/tungsten (Ti/TiN/W) stack with a total thickness of between about 1,000 Å and about 4,000 Å thick, is patterned over the surface of dielectric 144 to contact the first plug portion 94. While the conductive layer is formed as a single layer in the embodiment depicted, the conductive layer comprises a second plug portion 172 and a patterned conductive line 174 such as a digit line. Subsequent to forming the second plug portion 172 and patterned conductive line 174, wafer processing continues according to means known in the art.

Figure 4:
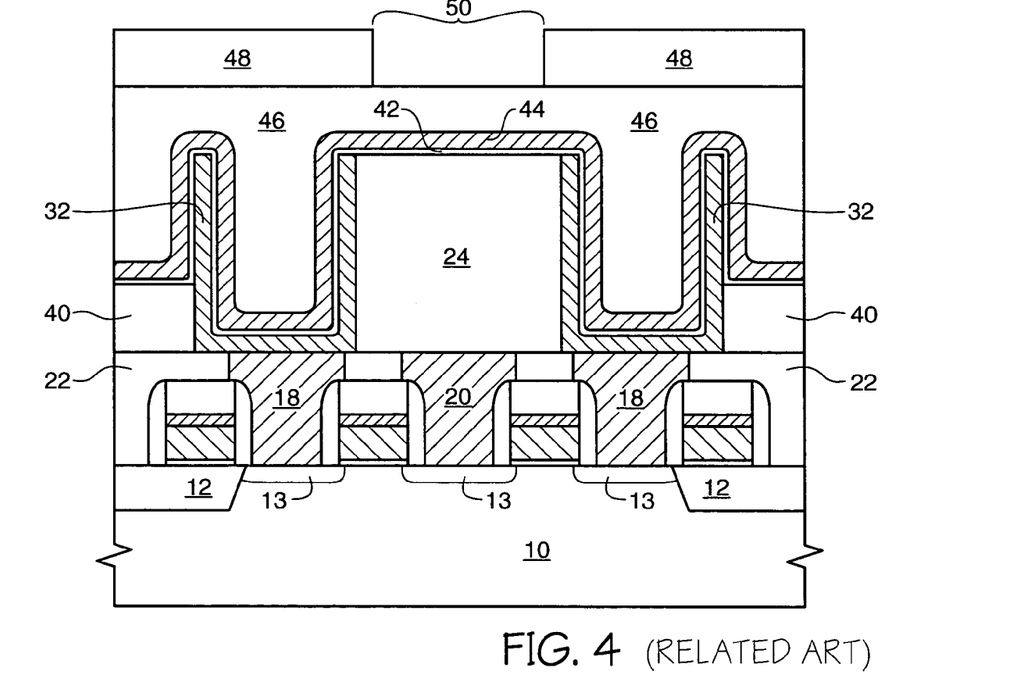
FIG. 4 depicts the FIG. 3 structure after etching the exposed oxide and after forming a cell nitride layer, a capacitor top plate layer, a planar oxide layer, and a patterned photoresist layer which defines a digit line contact opening.

The inventive process comprises various advantages over a conventional process. An etch to define a first portion 94 of the digit line plug removes less material than must be removed to form the plug with conventional processes. Referring to FIG. 4, a conventional process such as that described by FIGS. 1–6 can require etching of oxide 46 from about 10,000 Å to about 20,000 Å thick, polysilicon top plate layer 44 between about 500 Å and about 2,000 Å, cell nitride layer 42 between about 40 Å and about 70 Å thick, and BPSG layer 24 from about 10,000 Å to about 20,000 Å to expose the digit line contact pad 20, a total of between about 15,000 Å and about 30,000 Å of material. With an opening between about 2,000 Å and about 3,000 Å wide, this requires the formation of a contact opening having an aspect ratio between about 5:1 (based on a material thickness of 15,000 Å and an opening 3,000 Å wide) and about 15:1 (based on a material thickness of 30,000 Å and an opening 2,000 Å wide), averaging about 10:1. With the inventive process, BPSG layer 24, which is described in the exemplary background embodiment as being between about 10,000 Å and about 20,000 Å is etched to expose the digit line contact pad 20 (see FIG. 8). This results in a contact opening having an aspect ratio of between about 3.3:1 (based on a material thickness of 10,000 Å and an opening 3,000 Å wide) and about 10:1 (based on a material thickness of 20,000 Å and an opening 2,000 Å wide), averaging about 6:1. A first portion of the digit line plug is then formed. Subsequently, a second portion of the digit line contact plug is defined by etching oxide layer 144 about 4,000 Å thick, capacitor top plate layer 142 between about 500 Å and about 2,000 Å, and cell nitride layer 140 between about 40 Å and about 70 Å to expose the first portion 94 of the digit line contact. This requires etching through between about 4,540 Å and about 6,070 Å of material to form a contact opening having an aspect ratio of between about 1.5:1 and about 3:1, and averaging about 2.1:1.

An advantage of this process is that the plug 94 of FIG. 17 can be formed narrower than conventional devices. With conventional devices a very high aspect ratio contact opening must be etched. As the etch progress and the opening becomes deeper, it becomes more difficult to maintain the width of the opening and, typically, the opening narrows toward the bottom. Thus the etch must be started wide enough to ensure adequate width at the bottom. In contrast with the conventional device previously described with which BPSG 24, cell dielectric 42, capacitor top plate 44, and dielectric 46 must be etched to form a single opening, with an embodiment of the instant invention the BPSG 24 is first etched, and subsequently the cell dielectric, capacitor top plate, and dielectric is etched during a second etch. The plug 94 can therefore be formed narrower than with a conventional structure, and an embodiment of the instant invention therefore allows for the formation of liner layers 90 and 92 to provide an etch stop layer, and possibly allows a device with decreased size. These liner layers, especially nitride layer 90, function as an etch stop during the etching of layer 40 of the FIG. 12 structure. This etch allows the formation of a container structure which is double-sided around its entire periphery.

Further, the etch barrier or liner which comprises nitride 90 and TEOS 92 allows for a substantial misalignment of the photoresist layer 150 which defines opening 152. With a 200 Å nitride layer and a 550 Å TEOS layer the mask can be misaligned by almost 750 Å and the etch will not extend over the edge of nitride 90 and will still expose the plug 94.

The nitride portions of the liners are currently believed to be necessary to allow proper functioning of the device, if the nitride 90 is omitted and only the TEOS portion 92 is formed, it is now believed the plug 94 will adversely interact with the storage node 110 and top plate 112.

It should be noted that other materials can be used instead of the nitride specified for layers 80 and 92. The material used should be only minimally attacked during the wet etch of the BPS G for example a material having an etch selectivity of about 100:1 or greater with respect to BPSG. Ideally, the dielectric constant of the spacer material is minimized to reduce capacitive coupling. Other materials which may function suitably include fluorinated oxide (FSG) and boron nitride (BN).

It is well known in the art that it is more difficult to fill an opening having a high aspect ratio than an opening having a lower aspect ratio. With the conventional process having a digit line contact opening having a height of 2,000 Å, the opening which will be filled with conductive material must be 3,000 Å wide to maintain an aspect ratio of 7:1. With the opening as described for the conventional cell, it is not possible to narrow the plug by forming a liner because this would effectively increase the aspect ratio of the conductive plug.

The device of FIG. 17 depicts a top plate portion having a double vertical layer interposed between the liner and the bottom capacitor plate. The opening to the dielectric layer can be formed thinner than that depicted to result in a single vertical polysilicon portion interposed between the liner and the bottom plate. The opening in the dielectric between the liner and the bottom plate should be wide enough, however, to allow the formation of the polysilicon layer with sufficiently minimal polysilicon voiding to provide adequate capacitance between the bottom plate and the top plate. A double sided top plate increases the capacitance of the capacitor and provides a cell having improved electrical characteristics over a single sided capacitor or a capacitor which is double sided on only half of the capacitor such as that depicted in FIG. 6.

To maximize efficiency of the process the second plug portion 172 should be about the same height as the first plug portion 94. However, to maximize capacitor plate area by increasing the height of the plates 110, 142, the first plug portion 94 should be formed with the largest possible vertical dimension. Thus in one embodiment of the invention the first and second plug portions will both contribute about 50% to the overall height of the conductive plug. In a second embodiment which maximizes the area of the capacitor plates and maintains reasonable processing parameters, the first plug portion will contribute between about 75% and about 90% to the overall height of the conductive plug. In this embodiment, the height of the first plug portion is between about three times and about six times the height of the second plug portion.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
    first and second contact pads;
    a first plug portion electrically coupled with the first contact pad;
    a capacitor bottom plate electrically coupled with the second contact pad;
    a dielectric etch stop liner of a first material interposed between the bottom plate and the first plug portion;
    a dielectric spacer of a second material different from the first material interposed between the dielectric etch stop liner and the first plug portion and contacting the dielectric etch stop liner and the first plug portion;
    a capacitor top plate having a portion which at least partially extends over the etch stop liner, wherein the top plate portion is farther from the first contact pad than a top surface of the first plug portion, and wherein the top plate has an opening therein; and
    a second plug portion electrically coupled with the first plug portion and extending through the opening in the top plate.

2. The semiconductor device of claim 1 wherein the dielectric spacer is a first dielectric spacer and the semiconductor device further comprises a second dielectric spacer which electrically separates the second plug portion from the capacitor top plate portion.

3. The semiconductor device of claim 1 wherein the bottom plate comprises, in cross section, at least two vertically-oriented portions which define a container, wherein at least part of each vertically-oriented portion of the bottom plate is interposed between two vertically-oriented portions of the top plate and is separated by the two vertically-oriented portions of the top plate by a capacitor cell dielectric layer to form a double-sided container capacitor.

4. The semiconductor device of claim 1 further comprising a capacitor cell dielectric layer which contacts the etch stop liner and the capacitor top plate.

5. The semiconductor device of claim 1 further comprising a receptacle defined by said capacitor top plate, wherein the receptacle is interposed between the first plug portion and the capacitor bottom plate.

6. The semiconductor device of claim 5 wherein the first plug portion has a height, and a height of the receptacle is about ⅔ of the first plug portion height.

7. A semiconductor device, comprising:
    first and second conductive storage capacitor bottom plates each comprising a vertically-oriented sidewall;
    a conductive plug interposed between the first and second conductive storage capacitor bottom plates;
    a first cross-sectional etch stop liner of a first material interposed between the first conductive storage capacitor bottom plate and the conductive plug and a second cross-sectional etch stop liner interposed between the second conductive storage capacitor bottom plate and the conductive plug;

a first cross-sectional dielectric spacer of a second material different from the
first material interposed between the first cross-sectional etch stop liner and the conductive plug and a second cross-sectional dielectric spacer interposed between the second cross-sectional etch stop liner and the conductive plug; and
a conductive storage capacitor top plate comprising an opening therein and further comprising first and second vertical surfaces which define a first receptacle and third and fourth vertical surfaces which define a second receptacle,
wherein the first receptacle is interposed between the first conductive storage capacitor bottom plate and the conductive plug, and the second receptacle is interposed between the second conductive storage capacitor bottom plate and the conductive plug.

8. The semiconductor device of claim 7 wherein the conductive plug is a first portion of a conductive plug and the semiconductor device further comprises:
a second portion of the conductive plug electrically connected to the first portion of the conductive plug, wherein the second portion of the conductive plug passes through the opening in the capacitor top plate.

9. The semiconductor device of claim 7 wherein the first cross-sectional etch stop liner is interposed between the first receptacle of the conductive storage capacitor top plate and the conductive plug and the second cross-sectional etch stop liner is interposed between the second receptacle of the conductive storage capacitor top plate and the conductive plug.

10. A semiconductor device comprising:
first and second digit line contact plug portions, wherein the second digit line plug portion overlies and electrically connects with the first digit line plug portion;
a container capacitor bottom plate having first and second vertically-oriented, cross-sectional sidewalls and a horizontally-oriented bottom electrically connected with the first and second sidewalls, wherein the first and second sidewalls and the bottom define a receptacle and the vertically-oriented sidewalls each having a first surface inside the receptacle and a second surface outside the receptacle;
a container capacitor top plate having a first vertically-oriented surface inside the receptacle and second and third vertically-oriented surfaces outside the receptacle, wherein the first and second vertically-oriented surfaces of the top plate are separated from the first vertically-oriented sidewall of the bottom plate by only a capacitor cell dielectric layer and wherein the second and third surfaces of the top plate, together with a bottom horizontally-oriented surface of the top plate, define a receptacle;
an etch stop liner of a first material interposed between the first digit line contact plug portion and the container capacitor bottom plate; and
a dielectric spacer of a second material different from the first material interposed between the etch stop liner and the first digit line contact plug portion.

11. The semiconductor device of claim 10 further comprising the capacitor top plate having a hole therein wherein the second digit line plug portion passes through the hole in the capacitor top plate.

12. The semiconductor device of claim 10 wherein a height of the receptacle defined by the capacitor top plate is about ⅔ a height of the receptacle defined by the capacitor bottom plate.

13. The semiconductor device of claim 10 wherein a height of the receptacle defined by the capacitor top plate is about ⅔ a height of the first digit line contact plug portion.

* * * * *